US008164922B2

(12) United States Patent
Kim (10) Patent No.: US 8,164,922 B2
(45) Date of Patent: Apr. 24, 2012

(54) HEAT MANAGEMENT IN AN ELECTRONIC MODULE

(75) Inventor: Daehwan Daniel Kim, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/891,677

(22) Filed: Sep. 27, 2010

(65) Prior Publication Data

US 2011/0044006 A1 Feb. 24, 2011

Related U.S. Application Data

(62) Division of application No. 11/952,991, filed on Dec. 7, 2007, now Pat. No. 7,804,696.

(60) Provisional application No. 60/869,111, filed on Dec. 7, 2006.

(51) Int. Cl.
*H05K 7/14* (2006.01)
*H05K 7/18* (2006.01)

(52) U.S. Cl. ............... 361/801; 361/802; 361/696

(58) Field of Classification Search ............ 361/781, 361/801–802, 701–704, 709, 696–697, 711–714
See application file for complete search history.

(56) References Cited

U.S. PATENT DOCUMENTS

| 5,808,236 | A  | * | 9/1998  | Brezina et al. ........... 174/16.3 |
| 5,879,173 | A  |   | 3/1999  | Poplawski et al. |
| 6,434,007 | B1 | * | 8/2002  | Salmonson et al. ......... 361/709 |
| 6,474,876 | B1 |   | 11/2002 | Sikorski, Jr. |
| 6,720,690 | B2 |   | 4/2004  | Satoh et al. |
| 6,811,413 | B2 |   | 11/2004 | Keeble et al. |
| 6,816,376 | B2 | * | 11/2004 | Bright et al. ............... 361/704 |
| 6,826,052 | B2 | * | 11/2004 | Ma ............................ 361/709 |
| 6,893,293 | B2 |   | 5/2005  | Ice et al. |
| 6,916,122 | B2 | * | 7/2005  | Branch et al. ............... 385/92 |
| 6,980,437 | B2 | * | 12/2005 | Bright ........................ 361/704 |
| 6,986,679 | B1 | * | 1/2006  | Aronson et al. ............ 439/374 |
| 7,195,403 | B2 |   | 3/2007  | Oki et al. |
| 7,355,857 | B2 | * | 4/2008  | Pirillis et al. .............. 361/715 |
| 7,377,702 | B2 |   | 5/2008  | Jablonski et al. |
| 7,463,495 | B2 | * | 12/2008 | Tanaka et al. .............. 361/807 |
| 7,508,674 | B2 | * | 3/2009  | Li et al. ..................... 361/704 |
| 7,518,862 | B1 | * | 4/2009  | Macika et al. ............. 361/688 |
| 7,529,094 | B2 | * | 5/2009  | Miller ........................ 361/715 |
| 7,539,018 | B2 | * | 5/2009  | Murr et al. ................. 361/704 |
| 7,804,696 | B2 |   | 9/2010  | Kim |

FOREIGN PATENT DOCUMENTS

JP 2000-323848 11/2000
(Continued)

OTHER PUBLICATIONS

U.S. Appl. No. 11/952991, Sep. 8, 2009, Office Action.
(Continued)

*Primary Examiner* — Hung S Bui
(74) *Attorney, Agent, or Firm* — Maschoff Gilmore & Israelsen (57) ABSTRACT

In one example, a heat management system suitable for use in connection with an electronic module is disclosed. In a disclosed embodiment the heat management system includes a module guide configured to receive an electronic module. At least two heat sink elements are configured and arranged for movement independent of each other. At least two retention elements are configured to bias a respective heat sink element against any electronic module that is positioned within the module guide.

15 Claims, 7 Drawing Sheets

FOREIGN PATENT DOCUMENTS

| | | |
|---|---|---|
| JP | 2000-331755 | 11/2000 |
| JP | 2001-015218 | 1/2001 |
| JP | 2001-185307 | 7/2001 |
| JP | 2002-252058 | 9/2002 |
| JP | 2003-031323 | 1/2003 |
| WO | 2008/070873 | 6/2008 |

OTHER PUBLICATIONS

U.S. Appl. No. 11/952991, Apr. 26, 2010, Office Action.
U.S. Appl. No. 11/952991, Jun. 4, 2010, Notice of Allowance.

* cited by examiner

HEAT MANAGEMENT IN AN ELECTRONIC MODULE

CROSS-REFERENCE TO RELATED APPLICATIONS

This application is a divisional of, and claims priority to, U.S. application Ser. No. 11/952,991, filed on Dec. 7, 2007, entitled "ELECTROMAGNETIC RADIATION CONTAINMENT AND HEAT MANAGEMENT IN AN ELECTRONIC MODULE," which claims priority from U.S. Provisional Patent Application Ser. No. 60/869,111, filed Dec. 7, 2006 and entitled "EMI CONTAINMENT AND HEAT DISSIPATION IN AN ELECTRONIC MODULE," both of which are incorporated herein by reference in their entirety.

BACKGROUND

Electronic modules, such as electronic or optoelectronic transceiver or transponder modules, are increasingly used in electronic and optoelectronic communication. Some modules can be plugged into a variety of host networking equipment. Multi-Source Agreements ("MSAs"), such as the X2 MSA and 10 Gb/s Small Form Factor Pluggable ("XFP") MSA specify, among other things, package dimensions for modules. Conformity with an MSA allows a module to be plugged into host equipment designed in compliance with the MSA. Modules typically communicate with a printed circuit board of a host device by transmitting electrical signals to the printed circuit board and receiving electrical signals from the printed circuit board. These electrical signals can then be transmitted by the module outside the host device as optical and/or electrical signals.

One challenge inherent in modules concerns the generation of heat during the operation of the modules. This heat, if not dissipated, can cause a module to malfunction or to become damaged. A heat sink that is external to and separate from a module is sometimes used in connection with the module to help dissipate the heat generated by the module. However, such arrangements are only effective where there is substantial contact between the heat sink and one or more surfaces of the module. Such contact may not be readily attained where discontinuities and other imperfections exist in the heat sink and/or the module surfaces.

SUMMARY OF SOME EXAMPLE EMBODIMENTS

In general, example embodiments relate to heat management in an electronic module. The example heat management systems disclosed herein can contribute to desired performance of an electronic module.

In one example a heat management system includes a module guide configured to receive an electronic module. At least two heat sink elements are configured and arranged for movement independent of each other. In the example embodiment at least two retention elements are configured to bias a respective heat sink element against any electronic module that is positioned within the module guide.

In one embodiment, the module guide includes a pair of rails. While other configurations might be used, each rail can include a plurality of fingers that are each configured to engage with a host board of a host device in order to attach the rail of the module guide to the host board. Each rail might also include a plurality of hooks that are each configured to engage with a retention element in order to attach the retention element to the rail of the module guide.

In one embodiment, the retention element can be comprised of a clip that is integrally formed with a rail.

In example embodiments, each heat sink element can include a pair of protrusions each configured to engage a retention element, such as a clip, such that the pair of retention elements bias the heat sink element against a portion of any electronic module that is positioned within the module guide.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

To further clarify aspects of the example embodiments, a more particular description of these example embodiments will be rendered by reference to the appended drawings. It is appreciated that these drawings depict only example embodiments of the invention and are therefore not to be considered limiting of its scope. The example embodiments will be described and explained with additional specificity and detail through the use of the accompanying drawings in which.

DETAILED DESCRIPTION OF SOME EXAMPLE EMBODIMENTS

Example embodiments relate to electromagnetic radiation containment and heat management in an electronic module. The example electromagnetic radiation containment systems and heat management systems disclosed herein can contribute to desired performance of an electronic module.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

I. Example Electronic Module

Figure 1A:
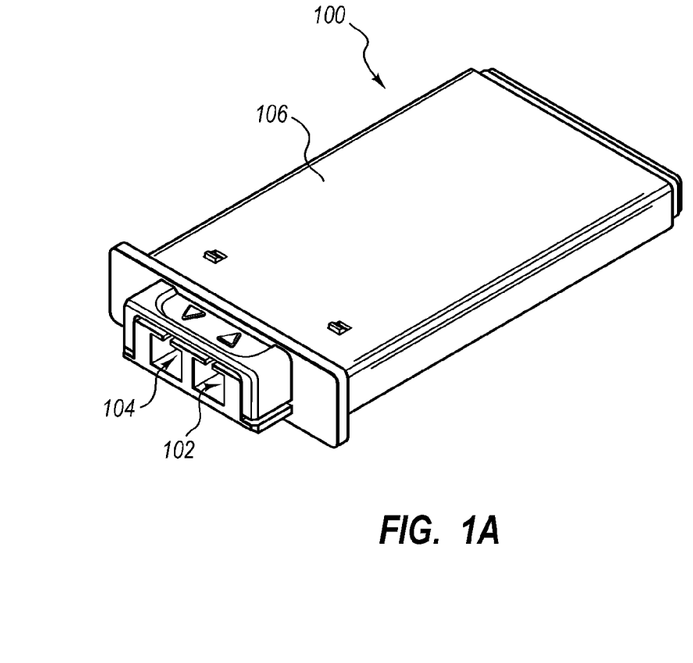
FIG. 1A is a front top perspective view of an example electronic module.
Figure 1B:
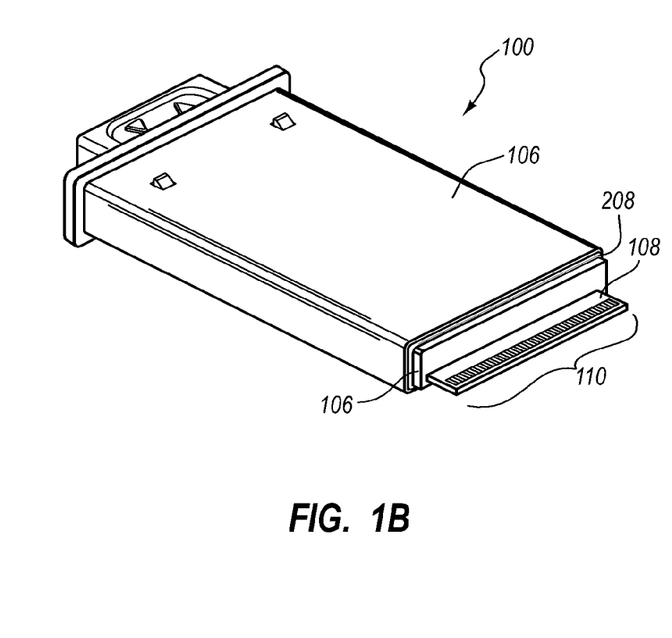
FIG. 1B is a rear bottom perspective view of the example electronic module of FIG. 1A.

Reference is first made to FIGS. 1A and 1B which disclose aspects of an example electronic module 100. In general, the module 100 can be any type of transponder or transceiver module, including a transponder module that substantially complies with the X2 MSA. The example module 100 includes an optical input port 102 and an optical output port 104 through which optical signals can be received or transmitted, respectively. The example module 100 also includes a housing 106 within which a printed circuit board 108 is partially positioned. The printed circuit board 108 defines an edge connector 110, extending from the housing 106, by way of which electrical signals can be transmitted and received.

Figure 1C:
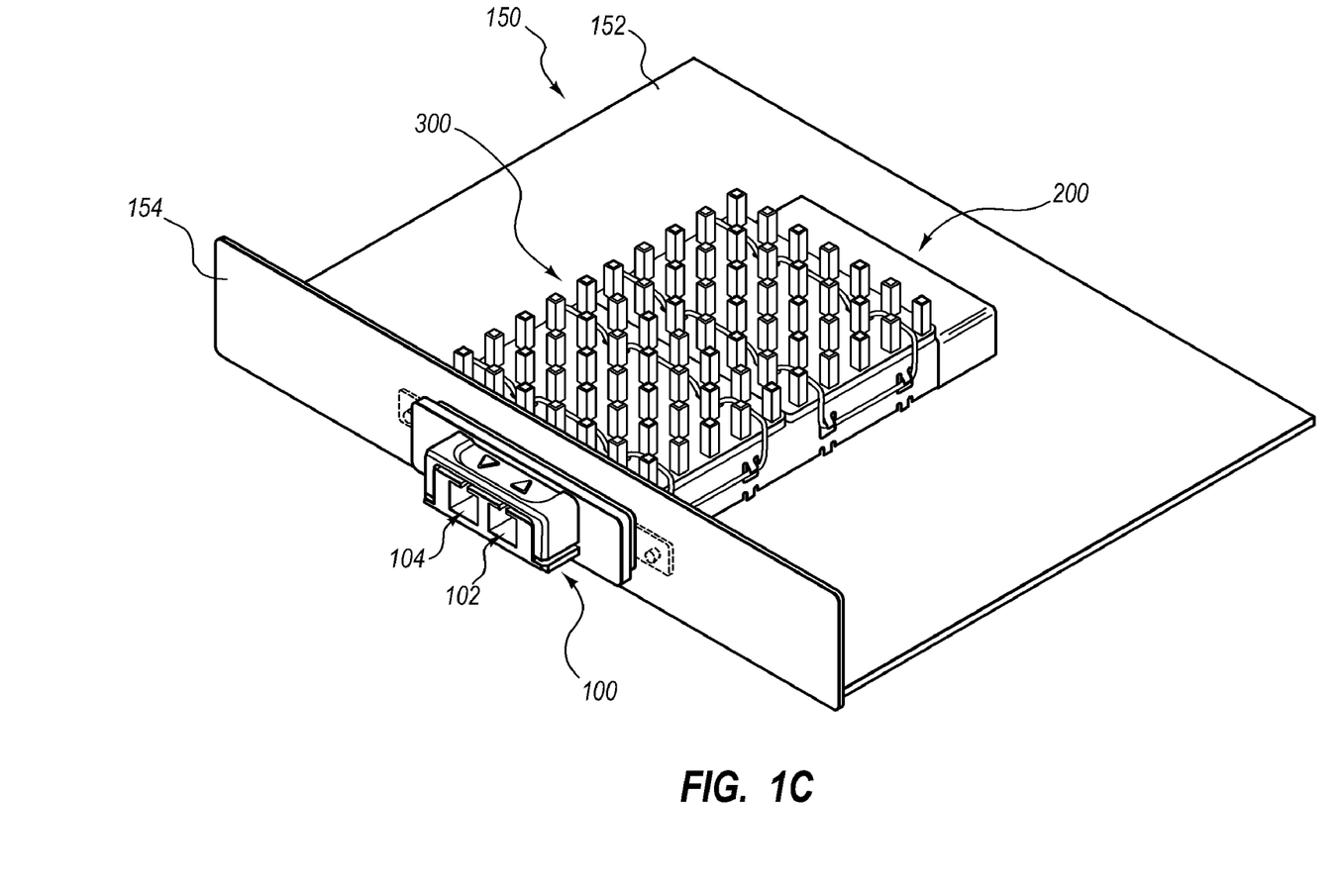
FIG. 1C is a front top perspective view of the electronic module of FIGS. 1A and 1B, as well as an example module guide, an example heat management system, and an example electromagnetic radiation containment system.

Turning now to FIG. 1C, the example module 100 is disclosed in connection with one example operating environment. In the example of FIG. 1C, the operating environment includes a host device 150 with a host board 152 and a face plate 154, an example electromagnetic radiation containment system 200, and an example heat management system 300. The module 100 is, in this example, a pluggable module that can be selectively engaged with, and disengaged from, the host device 150. In other embodiments, the module may be permanently fixed, for example, to the host board 152. When electrically connected with the host device 150, the module 100 can convert optical signals received at the optical input port 102 into electrical signals that are transmitted through the edge connector 110 (FIG. 1B) to the host board 152 of the host device 150 into which the module 100 is inserted. Similarly, electrical signals transmitted by the host board 152 can be received through the edge connector 110 (FIG. 1B) of the module 100 and then converted by the module 100 into optical signals for transmission through the optical output port 104.

It should be noted that the module 100 can be employed in connection with any suitable operating environment and is not constrained for use with the disclosed example environments. For example, embodiments of the module 100 can be employed in connection with any other operating environment that includes structures, systems and/or devices for physically and/or electrically interfacing with the module 100.

II. Example Electromagnetic Radiation Containment System

Figure 2A:
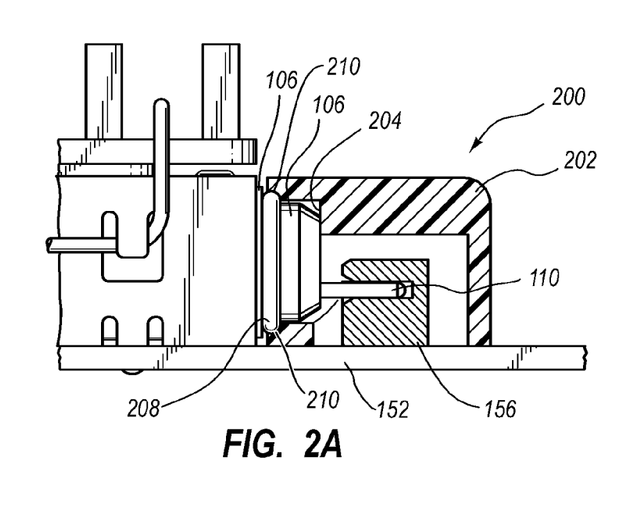
FIG. 2A is a partial side view of the example electromagnetic radiation containment system of FIG. 1C.
Figure 2B:
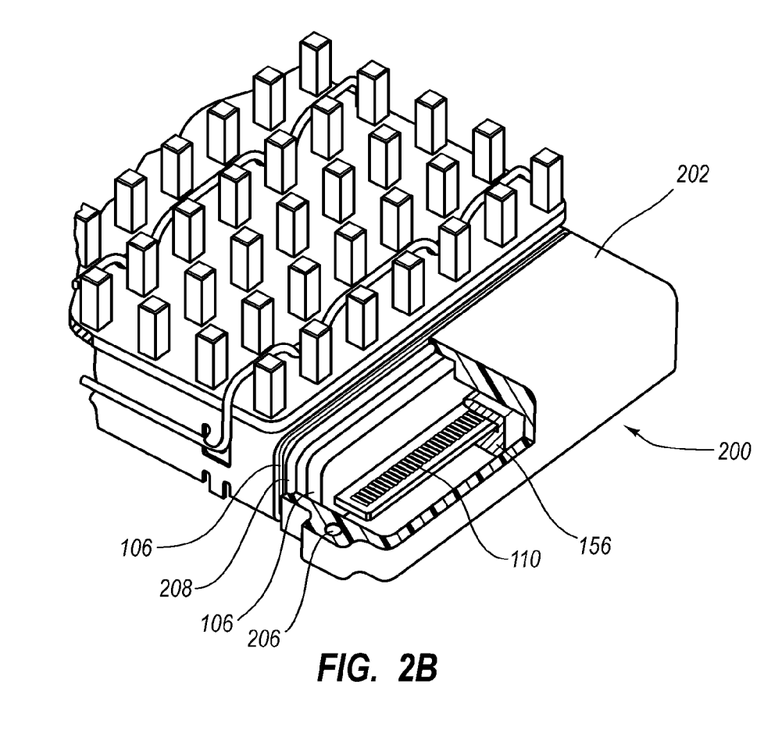
FIG. 2B is a partial rear top perspective view of the example electromagnetic radiation containment system of FIG. 1C.

With continued reference to the example operating environment disclosed in FIG. 1C, attention is directed now as well to FIGS. 2A and 2B which disclose aspects of one example of an electromagnetic radiation containment system denoted generally at 200.

It should be noted that embodiments of the electromagnetic radiation containment system 200 are not constrained for use in connection with any particular device, protocol, data rate or other specific parameter or group of parameters. Thus, while some embodiments of the electromagnetic radiation containment system 200 are particularly well suited for implementation in connection with 100 Gb/s transponder modules and/or transceiver modules, the scope of the invention is not so limited. That is, the various principles underlying the example electromagnetic radiation containment system 200 may be extended without limitation to any of a variety of different devices and operating environments.

Turning now to FIGS. 2A and 2B, the example electromagnetic radiation containment system 200 includes various components, some of which may be implemented in connection with the host board 152 or other device into which a device such as the module 100 may be removably plugged, and some of which may be included as part of the module 100. It should be noted that while various components disclosed herein are referred to as comprising elements of the example electromagnetic radiation containment system 200, alternative embodiments of an electromagnetic radiation containment system consistent with this disclosure may include more, fewer and/or different components. Accordingly, the example electromagnetic radiation containment system 200 is not intended to limit the scope of the invention in any way.

Thus, in the example disclosed in FIGS. 2A and 2B, the electromagnetic radiation containment system 200 includes a ground plane (not shown) mounted to the host board 152. In some embodiments, the shape and extent of the ground plane generally corresponds to the 'footprint' of the module 100 so that the metal body of the module 100 is in substantial physical contact with the ground plane when the module 100 is received by the host board 152.

The electromagnetic radiation containment system 200 additionally includes a shroud 202 that is configured and arranged, on its bottom side, for substantial contact with the ground plane. Additionally, the shroud 202 substantially, or completely in some embodiments, encloses a host board connector 156 and defines an opening by way of which the edge connector 110, or other type of connector, of the module 100 may interface with the host board connector 156. In one example embodiment, the host board connector 156 and edge connector 110 comprise a 125 pin interface, although other sizes and configurations may be implemented. Example configurations of comparable interfaces are disclosed in the X2 and XFP MSAs, and manufactured by Tyco Electronics Corp.

As disclosed in FIGS. 2A and 2B, the shroud 202 substantially encloses the host board connector 156. In one example embodiment, the shroud 202 is a single piece of material formed by die-casting or other manufacturing process. Various types of metals may be employed in the construction of the shroud 202. In some applications, a shroud made of a nickel copper (Ni—Cu) plated zinc (Zn) alloy may be particularly effective, although other types of base metals and/or plating materials may be employed. The use of die-cast techniques in the manufacture of the example shroud 202 enables the shroud 202 to be produced relatively inexpensively.

As well, the use of the shroud 202 as a dedicated electromagnetic radiation containment component enables separation of the component from the cage and/or guide rail design of the module 100. Consequently, the overall complexity of the host board/module design is reduced. As well, the use of a dedicated electromagnetic radiation shielding component eliminates the need to shield the entire module 100 and, in that regard, represents a significant advance in the efficiency and ease with which electromagnetic radiation can be contained.

As best disclosed in FIG. 2A, another useful aspect of the shroud 202 is that it defines a mechanical hard stop 204 which the housing 106 of the module 100 abuts when the edge connector 110 is fully inserted into the shroud 202. Among other things, this mechanical hard stop 204 aids in the prevention of damage to the edge connector 110. As well, the structure and configuration of the shroud 202 aids in the guiding of the module 100 toward the host board connector 156.

The shroud 202 may be attached to the host board 152 in any suitable fashion, such as by soldering for example, that is effective in ensuring good contact between the shroud 202 and the ground plane (not shown) of the host board 152. In the example disclosed in FIGS. 2A and 2B, the shroud 202 defines one or more tapped holes 206 configured to receive a fastener (not shown) passing through the host board 152 and the ground plane.

With continuing reference to FIGS. 2A and 2B, the example electromagnetic radiation containment system 200 further includes an electrically conductive sealing element 208, such as an O-ring or a D-Ring for example, that is disposed about one end of the housing 106 of the module 100 near the edge connector 110 of the module 100 (also shown in FIG. 1B). In this example, the module 100 defines a groove or other feature which aids in the retention of the sealing element 208 in a desired position and orientation. In at least one alternative embodiment, the sealing element 208 is retained by the shroud 202 rather than by the housing 106.

The sealing element 208 may be made of any suitable material(s). In one example implementation, the sealing element 208 is a metal-impregnated elastomer. The metal particles aid in electromagnetic radiation containment, while the compliant nature of the elastomer ensures a good and reliable seal between the module 100 and the shroud 202, as discussed in further detail below. Some example electrically conductive sealing elements include, but are not limited to, Chomerics D-ring and O-ring conductive elastomer gaskets manufactured by Parker Hannifin Corporation headquartered in Woburn, Mass. Yet other examples of suitable electrically conductive sealing elements include the Vanguard EMI/RFI shielding configurations manufactured by Vanguard Products Corporation headquartered in Danbury, Conn. However, the sealing element 208 is not limited to these examples.

Of course, variables such as the size and configuration of the sealing element 208 will depend upon the particular application. In one example 100 G module, the sealing element 208 has a substantially circular cross-section of about 1 mm to about 2 mm.

With continued attention to FIG. 2A, the sealing element 208 interfaces with the shroud 202 to substantially, or completely, in some embodiments, seal the edge connector 110 of the module 100 within the shroud 202. In the example embodiment of FIGS. 2A and 2B, the shroud 202 defines a feature 210 which is configured and arranged to receive at least a portion of the sealing element 208. By way of example, the feature 210 may comprise a groove, or portion thereof, having a cross-section that is similar in shape and size to a portion of the cross-section of the sealing element 208.

By virtue of its compliant nature, the sealing element 208 is able to make up for any tolerance stacking or other inaccuracies or imprecision in the manufacture of the module 100 and/or the shroud 202. As well, the sealing element 208 is quite robust and easy to install and replace when the need arises. Finally, the conductive particles or material in the sealing element 208 contribute significantly to electromagnetic radiation containment.

With continued reference to FIGS. 2A and 2B, other useful aspects of the example electromagnetic radiation containment system 200 concern the connector configuration of the module 100. Particularly, the positioning, above the host board 152, of the portion of the module 100 about which the sealing element 208 is disposed means that the interface between the module 100 and the shroud 202 is independent of the host board 152 or any other structures.

Further, the shroud 202 and sealing element 208 complete the enclosure of the edge connector 110 of the module 100. In this way, the shroud 202 and the sealing element 208 cooperate to complete a Faraday cage, which may or may not be substantially airtight, around the edge connector 110 of the module 100. In this way, electromagnetic radiation that would otherwise escape from the edge connector 110 and/or from the host board connector 156 and create EMI is substantially contained within the enclosure at least partially defined by the shroud 202 and sealing element 208. Such containment of electromagnetic radiation is particularly desirable in high speed/high frequency applications such as 100 Gb/s/100 GHz modules, although the containment functionality afforded by the example electromagnetic radiation containment system 200 extends as well to lower, and higher, speeds and/or frequencies.

III. Example Heat Management System

Figure 3A:
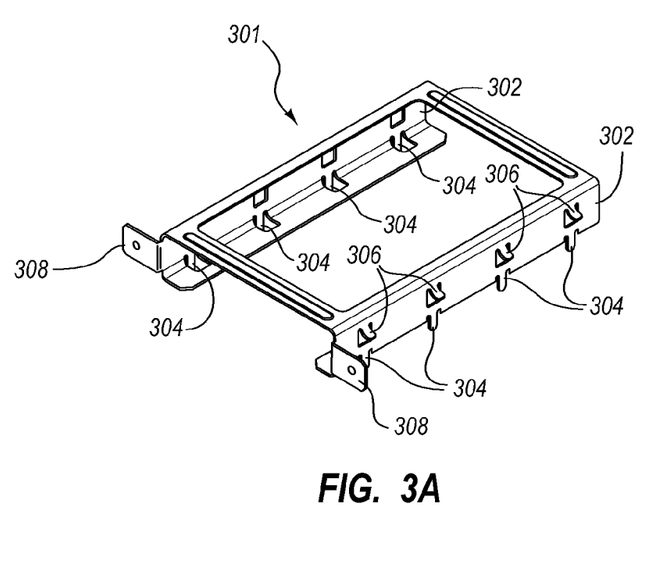
FIG. 3A is a front top perspective view of a portion of the example heat management system of FIG. 1C.
Figure 3B:
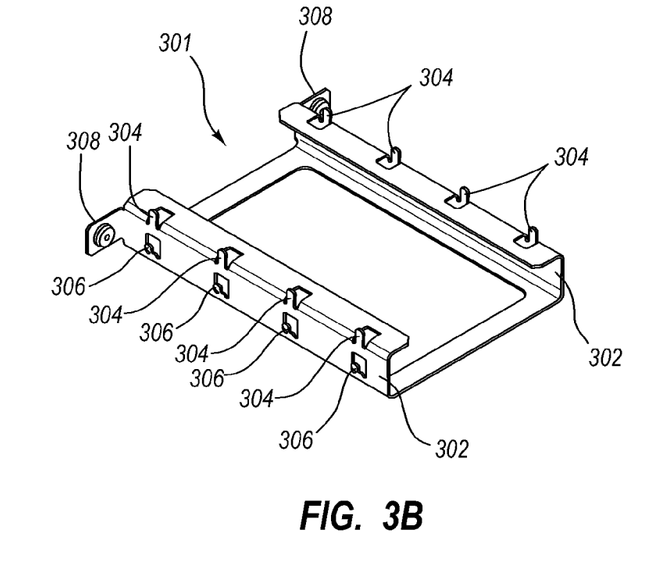
FIG. 3B is a rear bottom perspective view of the example heat management system of FIG. 1C.
Figure 4:
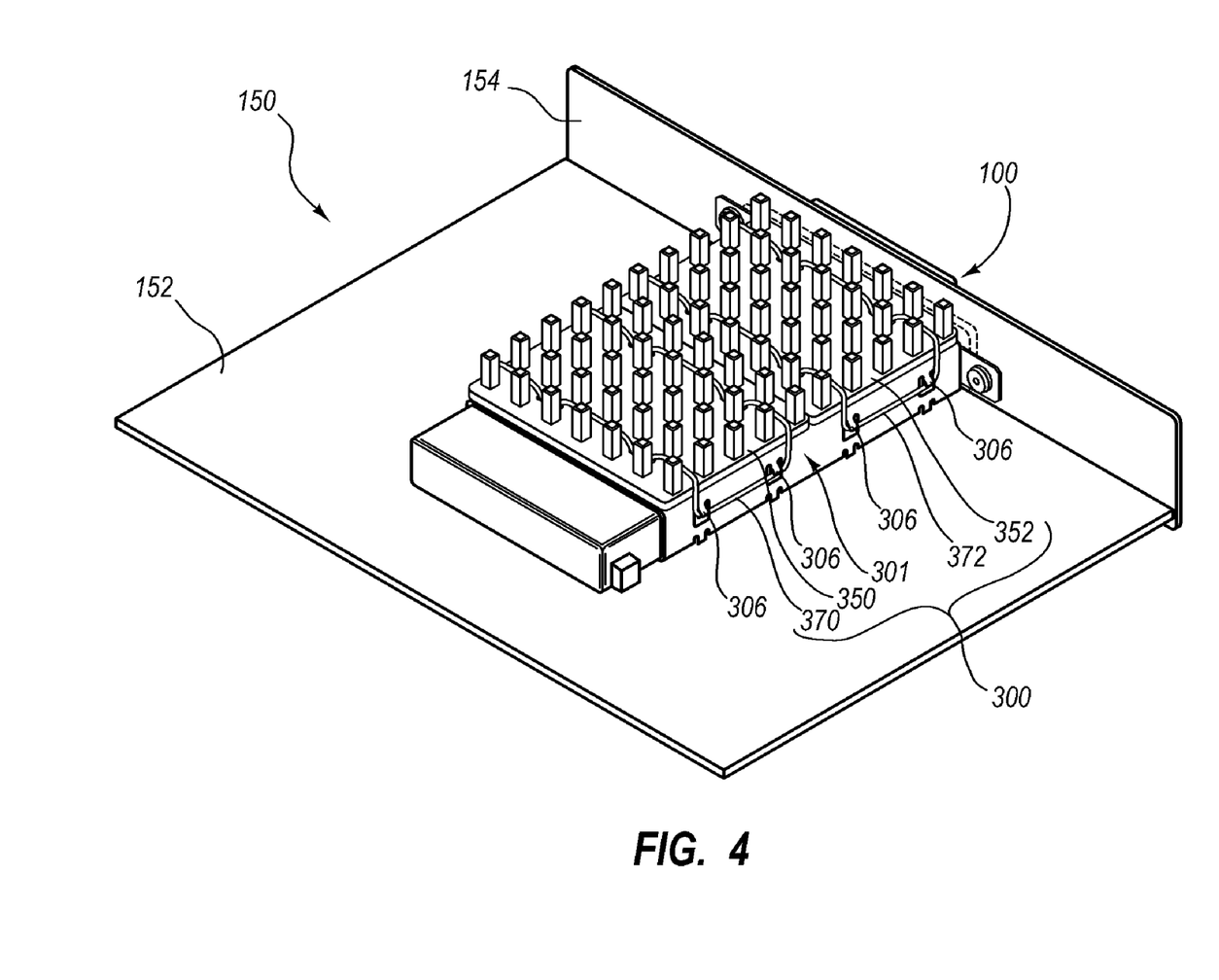
FIG. 4 is a rear top perspective view of the example heat management system of FIG. 1C.

Turning now to FIGS. 3A, 3B, and 4, additional aspects of the example heat management system 300 are disclosed. The example heat management system 300 generally includes an example module guide 301, example heat sink elements 350 and 352, and example retention elements 370 and 372. In at least some embodiments, as disclosed in FIG. 4, one or more of the heat sink elements 350 and 352 comprise a configuration having a substantially planar surface on one side of the heat sink element, and a plurality of extended surfaces on another side of the heat sink element, though the scope of the invention is not limited to such configurations.

With reference first to FIGS. 3A and 3B, the module guide 301 is configured to be mounted to a host board of a host device, such as the host board 152 of the host device 150 disclosed in FIG. 1C. The module guide 301 includes rails 302 which are configured and arranged such that the example module 100, or other module(s), can be reliably guided by the rails 302 into a proper position with respect to the host board to which the module guide 301 is attached. The module guide 301 also includes fingers 304 along the rails 302 which can be used to attach the module guide 301, such as by soldering for example, to a host board of a host device. The module guide 300 further includes hooks 306 along the rails 302 which can be used to engage, releasably in some cases, one or more retention elements for securing two or more heat sink elements, as discussed below in connection with FIG. 4. Finally, the module guide 301 includes one or more structures, such as flanges 308 for example, which can be used to attach the module guide 300 to a face plate of a host device, such as the face plate 154 of the host device 150.

With reference now to FIG. 4, two heat sink elements 350 and 352 are disclosed, positioned on the module guide 301 above the module 100. The heat sink elements 350 and 352 are held in position by retention elements 370 and 372, respectively. In this example embodiment, the retention elements 370 and 372 comprise clips configured to releasably engage respective hooks 306 located along the rails 302 (see FIGS. 3A and 3B), though the scope of the invention is not limited to the use of clips as retention elements. By virtue of their connection to the hooks 306, as well as their resilient nature, the retention elements 370 and 372 serve to bias the heat sink elements 350 and 352 such that heat sink elements 350 and 352 press down against, and make substantial contact with, the top of the module 100. In this way, the heat sink elements 350 and 352 contribute to the transfer of heat generated during the operation of the module 100.

As suggested by the Figures, each of the heat sink elements 350 and 352 is able to move independently of the other so as to press down against a respective portion of the top surface of the module 100. This capability of the heat sink elements 350 and 352 allows for looser tolerances for the planarity of the bottom surfaces of the heat sink elements 350 and 352 and the top surface of the housing 106 of the module 100 than where a single heat sink element is used to cover the entire top surface of the housing 106. That is, the use of multiple heat sink elements results in a heat sink element arrangement that is better configured to compensate for irregularities in the surface of the housing of a module and thereby contributes to an improved level of contact, and thus heat transfer, between the module surface and the group of heat sink elements.

Although FIG. 4 discloses only two heat sink elements covering the module 100, more than two heat sink elements could be used, resulting in even looser tolerances for the planarity of bottom surfaces of each of the heat sink elements and the top surface of the housing of the module 100. More generally, parameters such as the size, number, orientation and configuration of the heat sink elements may be varied as required to suit the constraints of a particular application. Accordingly, the scope of the invention is not limited to the example disclosed embodiments.

IV. Another Example Heat Management System

Figure 5:
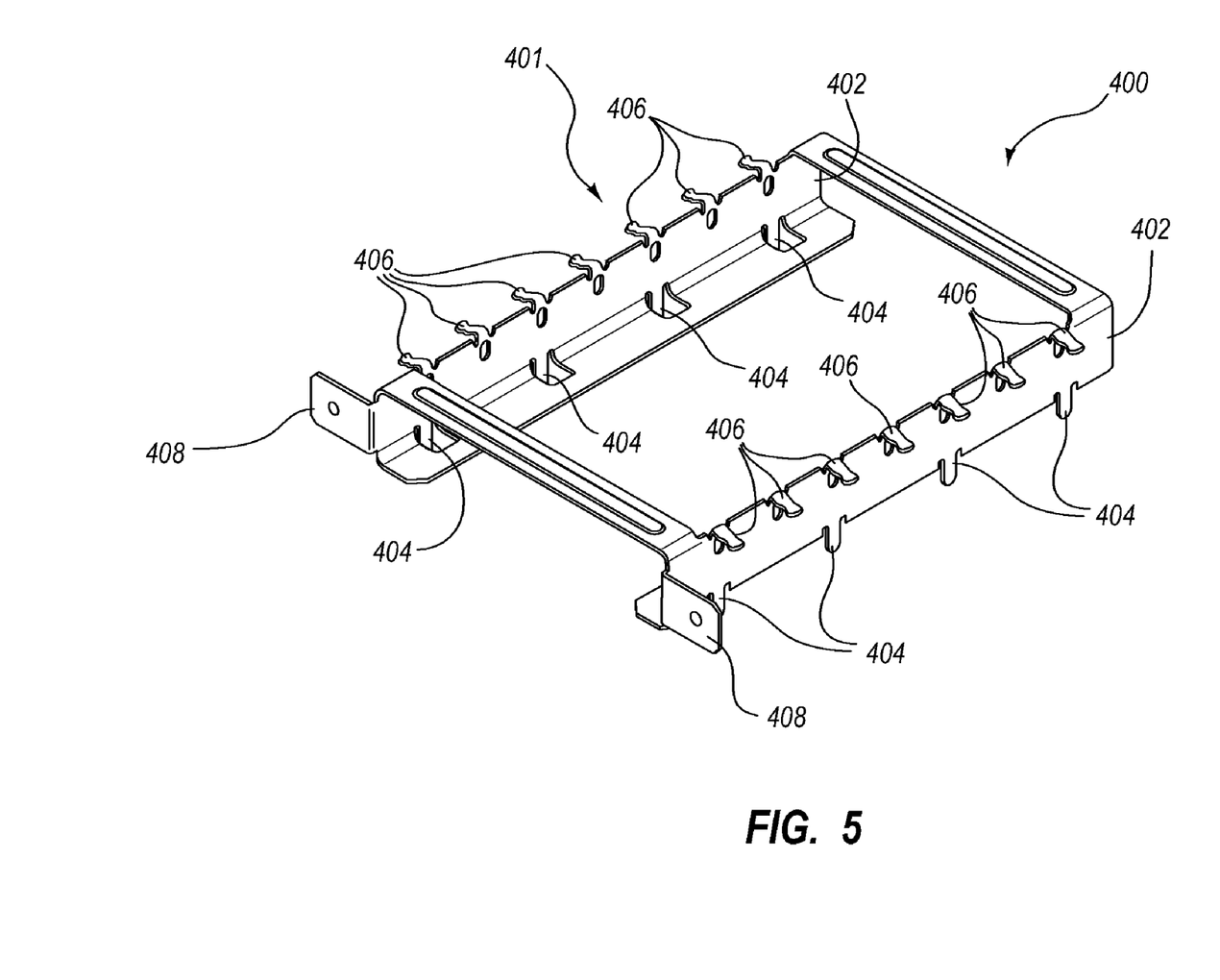
FIG. 5 is a front top perspective view of a portion of another example heat management system.

Turning now to FIGS. 5, 6A, 6B, and 6C, another example heat management system 400 is disclosed. With reference first to FIG. 5, an example module guide 401 is disclosed. The module guide 401 includes rails 402, fingers 404, and flanges 408 that may be identical to, respectively, rails 302, fingers 304, and flanges 308 of the example module guide 300 discussed above in connection with FIGS. 3A and 3B. In addition, the example module guide 400 further includes retention elements 406, which may or may not be integrally formed with the rails 402, configured and arranged to engage corresponding heat sink elements, as discussed below in connection with FIGS. 6A-6C. In the illustrated example, the retention elements 406 each comprises a structure that extends from the rail 402 and terminates in a free end though, as noted earlier, the scope of the invention is not limited to any particular embodiment of a retention element.

Figure 6A:
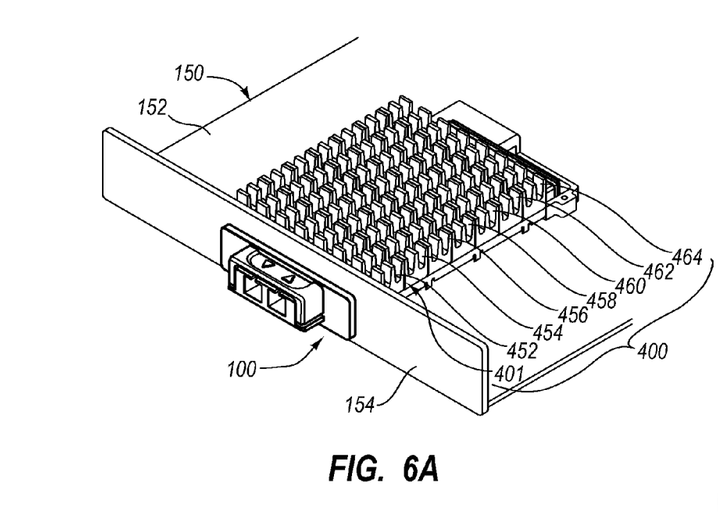
FIG. 6A is a front top perspective view of portions of the example heat management system of FIG. 5.
Figure 6B:
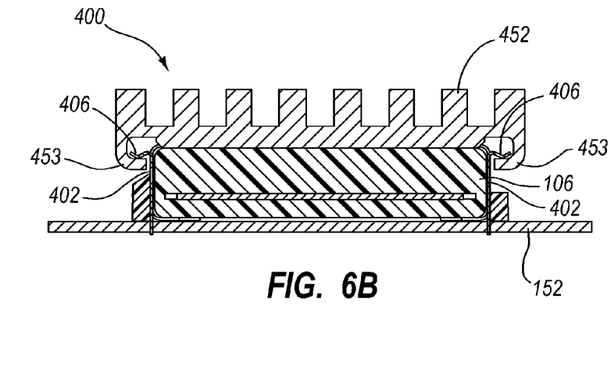
FIG. 6B is a partial rear view of portions of the example heat management system of FIG. 5.
Figure 6C:
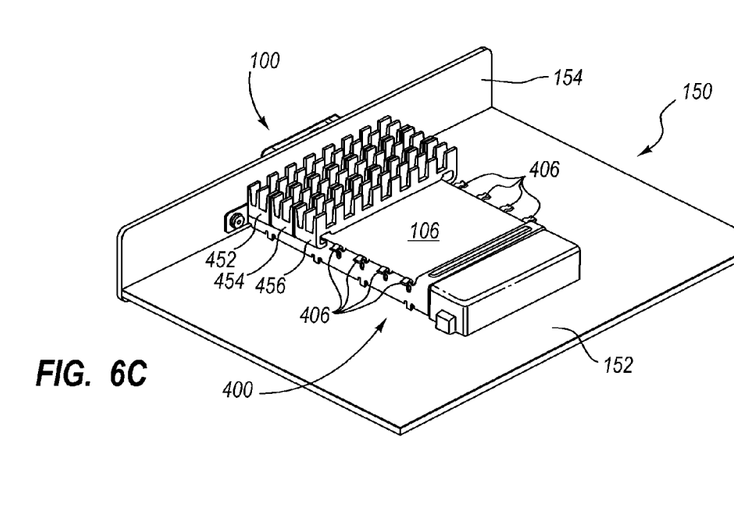
FIG. 6C is a rear top perspective view of portions of the example heat management system of FIG. 5.

With reference now to FIGS. 6A-6C, disclosed are seven heat sink elements 452-464 positioned on the module guide 401 above the module 100. As disclosed in FIG. 6B, the heat sink element 452 is held in position atop the module 100 by the retention elements 406 located along the rails 402 of the module guide 400. The respective free ends of the retention elements 406 bias against protrusions 453 of the heat sink element 452 such that heat sink element 452 is pressed down against the top of the module 100. The heat sink elements 452-464 function similarly to the heat sink elements 370 and 372 to enable the transfer of heat generated during the operation of the module 100. Similarly, each of the heat sink elements 452-464 presses down, independently of the other heat sink elements, against a respective portion of the top surface of the module 100.

This independent movement of the heat sink elements 452-464 allows for looser tolerances for the planarity of the bottom surfaces of the heat sink elements 452-464 and the top surface of the housing 106 of the module 100 than would be possible if a single heat sink element were used to attempt to contact the entire top surface of the housing 106 of the module 100. The improved degree of contact afforded by the use of the multiple heat sink elements thus results in a heat sink arrangement that exhibits improved heat transfer characteristics and, thus, device performance.

The example embodiments disclosed herein may be embodied in other specific forms. These example embodiments are to be considered in all respects only as illustrative and not restrictive.

What is claimed is:

1. A heat management system comprising:
    a module guide configured to receive a single pluggable electronic module;
    at least two heat sink elements configured and arranged for movement independent of each other, each heat sink element having a substantially planar surface on one side of the heat sink element and a plurality of extended surfaces on another side of the heat sink element, a first one of the heat sink elements abutting a second one of the heat sink elements; and
    at least two retention elements configured to bias the substantially planar surfaces of the at least two heat sink elements against a single substantially planar surface of the single pluggable electronic module when the pluggable electronic module is positioned within the module guide.

2. The heat management system as recited in claim 1, wherein the module guide comprises a pair of rails.

3. The heat management system as recited in claim 2, wherein each rail comprises:
    a plurality of fingers each configured to engage with a host board of a host device in order to attach the rail of the module guide to the host board; and
    a plurality of hooks each configured to engage with a retention element in order to attach the retention element to the rail of the module guide.

4. The heat management system as recited in claim 3, wherein each retention element comprises a clip.

5. The heat management system as recited in claim 4, wherein each clip is shaped from a wire having a substantially circular cross section and is configured to engage a hook on both of the rails.

6. The heat management system as recited in claim 4, wherein the at least two heat sink elements comprise seven heat sink elements.

7. The heat management system as recited in claim 2, wherein each retention element comprises a clip integrally formed with one of the rails.

8. The heat management system as recited in claim 7, wherein each heat sink element includes a pair of protrusions each configured to engage one of the clips such that the pair of engaged clips bias the heat sink element against a portion of any electronic module that is positioned within the module guide.

9. The heat management system as recited in claim 2, wherein the plurality of extended surfaces are uniformly distributed across the heat sink elements without variation at any seam between two heat sink elements.

10. The heat management system as recited in claim 1, wherein the heat sink elements bias directly against the pluggable electronic module without intervening thermally conductive interface material.

11. The heat management system as recited in claim 1, wherein each of the heat sink elements abuts at least another of the heat sink elements.

12. The heat management system as recited in claim 11, wherein no portion of the module guide is positioned between any two abutting heat sink elements.

13. The heat management system as recited in claim 11, wherein the abutting heat sink elements cooperate to form a substantially gapless covering of any electronic module that is positioned within the module guide.

14. The heat management system as recited in claim 1, wherein the module guide defines only a single opening that enables the substantially planar surfaces of the heat sink elements to bias against the single substantially planar surface of any pluggable electronic module that is positioned within the module guide.

15. The heat management system as recited in claim 1, wherein a length of each of the sink elements is positioned substantially perpendicular to a length of any electronic module that is positioned within the module guide, where length is greater than width.

* * * * *